(12) United States Patent
Smith et al.

(10) Patent No.: US 9,324,701 B2
(45) Date of Patent: Apr. 26, 2016

(54) DIODE CIRCUIT LAYOUT TOPOLOGY WITH REDUCED LATERAL PARASITIC BIPOLAR ACTION

(71) Applicant: Silicon Laboratories Inc., Austin, TX (US)

(72) Inventors: Jeremy C. Smith, Austin, TX (US);
Anirudh Oberoi, Castle Green (SG);
William Moore, Austin, TX (US);
Michael Khazhinsky, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 269 days.

(21) Appl. No.: 14/177,670

(22) Filed: Feb. 11, 2014

(65) Prior Publication Data

US 2015/0228638 A1    Aug. 13, 2015

(51) Int. Cl.
*H01L 29/47* (2006.01)
*H01L 27/02* (2006.01)
*H01L 29/861* (2006.01)
*H01L 29/06* (2006.01)

(52) U.S. Cl.
CPC ........ *H01L 27/0248* (2013.01); *H01L 27/0255* (2013.01); *H01L 29/0649* (2013.01); *H01L 29/8613* (2013.01)

(58) Field of Classification Search
None
See application file for complete search history.

(56) References Cited

U.S. PATENT DOCUMENTS

| | | | |
|---|---|---|---|
| 7,002,216 B2 | 2/2006 | Huang | |
| 2010/0187566 A1* | 7/2010 | Jou | H01L 29/7393 257/137 |
| 2015/0194417 A1* | 7/2015 | Smith | H01L 27/0248 361/56 |
| 2015/0228638 A1* | 8/2015 | Smith | H01L 27/0248 257/491 |

OTHER PUBLICATIONS

Smith, "Snapback Inhibiting Clamp Circuitry for Mosfet ESD Protection Circuits", SILA:484, U.S. Appl. No. 14/149,112, filed Jan. 7, 2014, 33 pgs.

* cited by examiner

*Primary Examiner* — Jack Chen
(74) *Attorney, Agent, or Firm* — Egan, Peterman, Enders & Huston LLP

(57) ABSTRACT

Diode circuit layout topologies and methods are disclosed that exhibit reduced lateral parasitic bipolar characteristics at lateral parasitic bipolar circuit emitter edges during ESD or other voltage events as compared to conventional circuit layout topologies. The disclosed diode circuit layout topologies may be implemented to recess parasitic emitter ends relative to surrounding well ties, for example, to reduce or substantially eliminate parasitic bipolar action at lateral emitter edges of the circuitry during ESD events so as to provide higher current threshold for device failure, allowing for smaller device area and/or improved ESD robustness for a given circuit device.

22 Claims, 9 Drawing Sheets

(SECTION CC)

(SECTION DD)

(Section AA')

(Section BB')

DIODE CIRCUIT LAYOUT TOPOLOGY WITH REDUCED LATERAL PARASITIC BIPOLAR ACTION

FIELD OF THE INVENTION

This invention relates to diode circuitry and, more particularly, to parasitic bipolar circuit layout topologies.

BACKGROUND OF THE INVENTION

FIGS. 1-3 illustrate a layout topology for a conventional Nwell diode 100 that is employed as an ESD diode for signal output circuitry. As shown in FIG. 1, Nwell diode 100 includes an Nwell 102 formed in a P-type substrate 104. Elongated N+ doped regions 106 and P+ doped regions 108 of equal length are formed within Nwell 102 as shown and separated by field oxide 107 as shown in FIGS. 2 and 3 (oxide 107 not shown in FIG. 1). A P+ doped guard ring structure 110 coupled via conductive (metal) pad 124 to negative supply rail ($V_{SS}$) is formed as shown to surround elongated N+ doped finger regions 106 and P+ doped regions 108, with a positive supply rail ($V_{DD}$) coupled via conductive (metal) pad 120 to N+ doped regions 106 and a conductive (metal) pad 122 of P+ doped regions 108 coupled to an output signal node or pad of an output buffer circuit. FIG. 2 illustrates section A-A of FIG. 1 and its parasitic vertical PNP bipolar device which is active during the occurrence of an electrostatic discharge (ESD) event, that causes a portion of the ESD current ($I_E$) from conductive pad 122 to flow to $V_{SS}$. FIG. 3 illustrates section B-B of FIG. 1 and its associated parasitic lateral PNP bipolar device which can also be active during the occurrence of the same ESD event.

During occurrence of an ESD event, a portion of $I_E$ flows vertically through vertical parasitic PNP bipolar device 121 to P-type substrate 104 and to $V_{SS}$ via P+ guard ring 110 as shown in FIG. 2 in a manner which is generally beneficial. At the same time, a portion of $I_E$ can also flow laterally through lateral parasitic PNP bipolar device 123 to P-type substrate 104 and to $V_{SS}$ via substrate 104 and P+ guard ring 110 as shown in FIG. 3, in manner that can cause early breakdown of lateral bipolar device 123 relative to vertical bipolar device 121, which usually leads to early failure at the ends of each of the P+ doped fingers 108. In this regard, the depth 332 of Nwell 102 sets the base width of the vertical parasitic PNP bipolar device 121 (as shown in cross section A-A of FIG. 2), while the lateral width 330 of the region of Nwell 102 that overlaps the ends of P+ doped fingers 108 sets the base width of the lateral PNP device (as shown in cross section B-B of FIG. 3).

FIG. 4 illustrates another type of a layout topology for a conventional Nwell diode 400 that is employed as an ESD diode for signal output circuitry. As shown in FIG. 4, Nwell diode 400 includes an Nwell 402 formed in a P-type substrate 404. Elongated P+ doped regions 408 having conductive (metal) pads 422 are enclosed by N+ doped regions 406 having conductive (metal) pads 420, each of which are formed within Nwell 402 and separated by field oxide (oxide not shown in FIG. 4). A P+ doped guard ring structure 410 coupled to negative supply rail ($V_{SS}$) by conductive pads 424 is formed as shown to surround N+ doped enclosure region 406 and elongated P+ doped regions 408, and a positive supply rail ($V_{DD}$) coupled via conductive pads 420 to N+ doped regions 406 and signal pads 422 of P+ doped regions 408 coupled to an output signal node or pad of an output buffer circuit.

Deep nwell (DNW) is a well known process option for semiconductor fabrication processes which is used to create distinct regions of P-type material which are electrically isolated from the underlying P-type substrate. Here N-type dopant is implanted in regions defined by DNW masking regions, such that the impurity concentration peaks at a distance below the surface of the P-type substrate. At the same time, the DNW masking regions are fully encircled by an annular ring of N+/Nwell which in turn electrically links or connects with the deep DNW dopant layer. This creates an isolated P-type region, which is junction isolated from the P-type substrate on the sides by N+/Nwell and on the bottom by DNW. Similar geometrical patterns of equal length elongated P+ doped regions and N+ doped regions, or N+ doped regions enclosed by P+ doped regions have been employed for forming DNW ESD diodes for signal output circuitry. Here, a complimentary parasitic vertical NPN is formed between the pad connected N+ regions, the isolated P-type region and the underlying DNW region and a parasitic lateral NPN formed between the edges of the pad connected N+ regions, the isolated P-type region and the annular N+/Nwell ring which encircles the DNW region.

SUMMARY OF THE INVENTION

Disclosed herein are diode circuit layout topologies and methods that exhibit reduced lateral parasitic bipolar characteristics at lateral parasitic bipolar circuit emitter edges during ESD or other voltage events as compared to conventional circuit layout topologies. Advantageously, the disclosed ESD diode circuit layout topologies may be implemented in one exemplary embodiment to reduce or substantially eliminate parasitic bipolar action at lateral emitter edges of the circuitry during ESD events so as to provide a higher current threshold for device failure, allowing for smaller device area and/or improved ESD robustness for a given circuit device. In this regard, the parasitic emitter ends of lateral finger regions may be recessed relative to surrounding well ties to inhibit conduction at the finger ends during ESD events. The parasitic emitter ends of the finger regions tend to be high electric field regions, and the disclosed circuit layout topologies may be implemented to reduce the strength of the electric field at the emitter ends to help prevent current flow/current crowding in these regions during ESD events.

In one exemplary embodiment, an Nwell ESD diode circuit layout topology may be provided that includes alternating parallel elongated P+ doped and N+ doped finger regions disposed within an Nwell region that is formed within a P-type substrate such that parasitic bipolar PNP devices exist at the lateral edges of the finger regions between the ends of the P+ doped finger regions (which act as emitters) and the P-type substrate and surrounding P+ guard ring. However, in this embodiment, the emitter ends of the P+ doped elongated finger regions may be recessed inward relative to the ends of the N+ doped elongated finger regions, away from the edge of the surrounding Nwell region to simultaneously decrease the strength of the electric field across the lateral PNP device and reduce its β (or gain). In this embodiment, the recessed nature of the emitter ends of the P+ doped finger regions increases the distance between the ends of the P+ doped finger regions and the surrounding P+ guard ring so as to increase the breakdown voltage of the lateral PNP device, which effectively extends the failure voltage of the overall device, thus providing more ESD design margin. At the same time, the non-recessed ends of N+ doped elongated finger regions extend closer to the edge of the Nwell region edge to robustly tie the Nwell to $V_{DD}$ so as to provide better latch-up immunity. The circuit layout topology of this embodiment may be advantageously implemented to increase the breakdown voltage of lateral parasitic bipolar PNP devices in comparison to conventional non-recessed P+ doped elongated finger regions such as illustrated in FIGS. 1-3, while at the same time surrounding the recessed parasitic P+ emitters with a robust Nwell tie out to the edges of the Nwell region, to reduce or substantially eliminate the potential for latch-up occurrence.

In another exemplary embodiment, a deep Nwell ESD diode circuit layout topology may be provided that includes alternating elongated P+ doped and N+ doped finger regions disposed within an isolated Pwell/Retrograde well (Rwell) region that itself is disposed within a deep Nwell region formed within a P-type substrate such that parasitic bipolar NPN devices exist at the lateral edges of the N+ doped finger regions between the ends of the N+ doped finger regions (which act as emitters) and a surrounding Nwell and N+ isolating ring enclosure. In this embodiment, the emitter ends of the N+ doped elongated finger regions may be recessed inward relative to the ends of the P+ doped elongated finger regions, away from the edge of the surrounding Nwell region to simultaneously decrease the strength of the electric field across the lateral NPN device and reduce its β (or gain). Similar to the recessed P+ doped finger regions of the parasitic PNP embodiment, the recessed nature of the emitter ends of the N+ doped finger regions increases the distance between the ends of the N+ doped finger regions and the surrounding N+/Nwell guard ring so as to increase the breakdown voltage of the lateral NPN device relative to the vertical NPN device, which effectively extends the failure voltage of the overall device, thus providing more ESD design margin in a similar manner as described for the parasitic PNP embodiment.

In one respect, disclosed herein is a semiconductor circuit device, including: a semiconductor substrate; and at least one diode structure formed in the substrate, the diode structure including elongated N+ doped regions alternating with elongated P+ doped regions that are together surrounded by a P+ doped or N+ doped/Nwell guard ring. Each of the elongated N+ doped regions may extend between first and second ends with no P+ doped region disposed between the first and second ends of the elongated N+ doped regions and the surrounding guard ring, and each of the elongated P+ doped regions may extend between first and second ends with no N+ doped region disposed between the first and second ends of the elongated P+ doped regions and the surrounding guard ring. Either the first and second ends of the elongated P+ doped regions may each be recessed inward relative to the first and second ends of the elongated N+ doped regions such that a lateral distance between each of the first and second ends of the elongated P+ doped regions and the surrounding guard ring is greater than a lateral distance between each of the first and second ends of the elongated N+ doped regions and the surrounding guard ring, or the first and second ends of the elongated N+ doped regions may each be recessed inward relative to the first and second ends of the elongated P+ doped regions such that a lateral distance between each of the first and second ends of the elongated N+ doped regions and the surrounding guard ring is greater than a lateral distance between each of the first and second ends of the elongated P+ doped regions and the surrounding guard ring.

In another respect, disclosed herein is a semiconductor electrostatic discharge (ESD) diode circuit device, including: a semiconductor substrate; and at least one diode structure formed in the substrate, the diode structure including elongated N+ doped regions alternating with elongated P+ doped regions that are together surrounded by a P+ doped or N+ doped/Nwell guard ring. Each of the elongated N+ doped regions may extend between first and second ends with no P+ doped region disposed between the first and second ends of the elongated N+ doped regions and the surrounding guard ring, and each of the elongated P+ doped regions may extend between first and second ends with no N+ doped region disposed between the first and second ends of the elongated P+ doped regions and the surrounding guard ring. Either the first and second ends of the elongated P+ doped regions may each be recessed inward relative to outwardly projecting first and second ends of the elongated N+ doped regions such that a lateral distance between each of the first and second ends of the elongated P+ doped regions and the surrounding guard ring is greater than a lateral distance between each of the first and second ends of the elongated N+ doped regions and the surrounding guard ring, with each of the elongated P+ doped regions being coupled to an output buffer signal node, each of the elongated N+ doped regions being coupled to a positive supply rail, and the surrounding guard ring being coupled to a negative supply rail; or the first and second ends of the elongated N+ doped regions may each be recessed inward relative to outwardly projecting first and second ends of the elongated P+ doped regions such that a lateral distance between each of the first and second ends of the elongated N+ doped regions and the surrounding guard ring is greater than a lateral distance between each of the first and second ends of the elongated P+ doped regions and the surrounding guard ring, with each of the elongated N+ doped regions being coupled to an output buffer signal node, each of the elongated P+ doped regions being coupled to a negative supply rail, and the surrounding guard ring being coupled to a positive supply rail.

DESCRIPTION OF ILLUSTRATIVE EMBODIMENTS

Figure 5A:
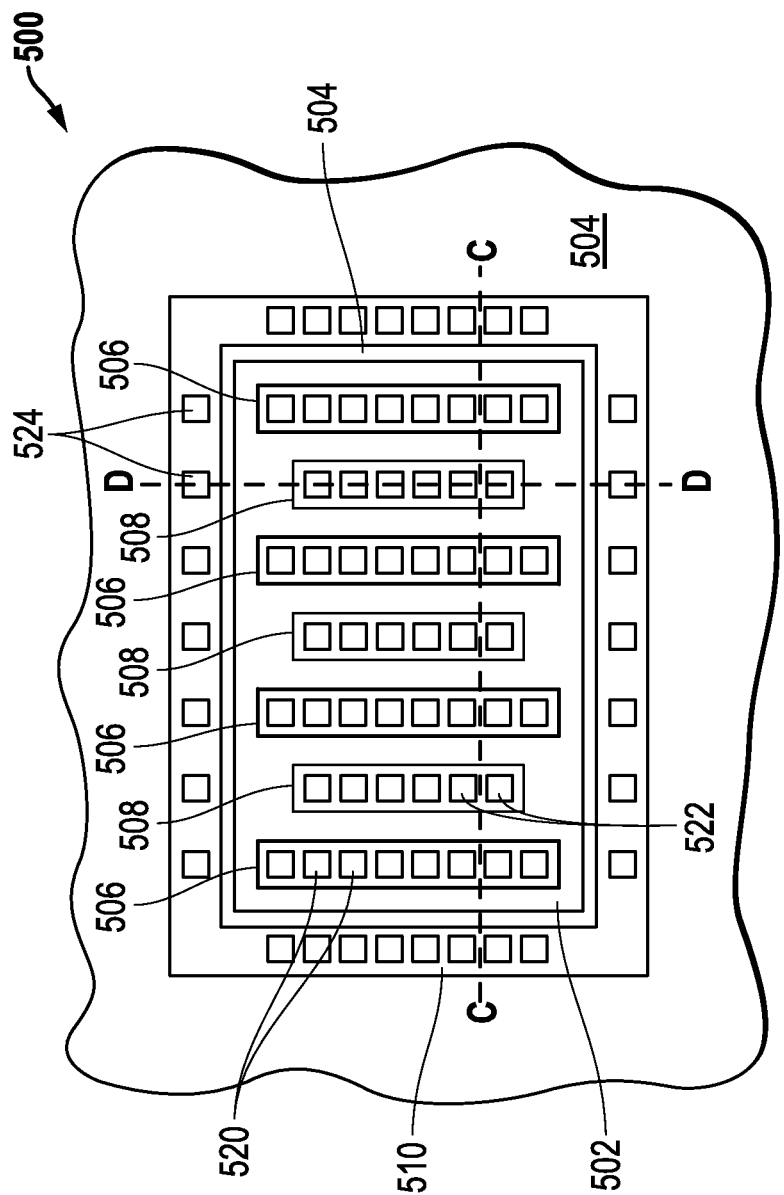
FIG. 5A illustrates an overhead view of layout topology for an Nwell diode according to one exemplary embodiment of the disclosed circuit topologies and methods.
Figure 5B:
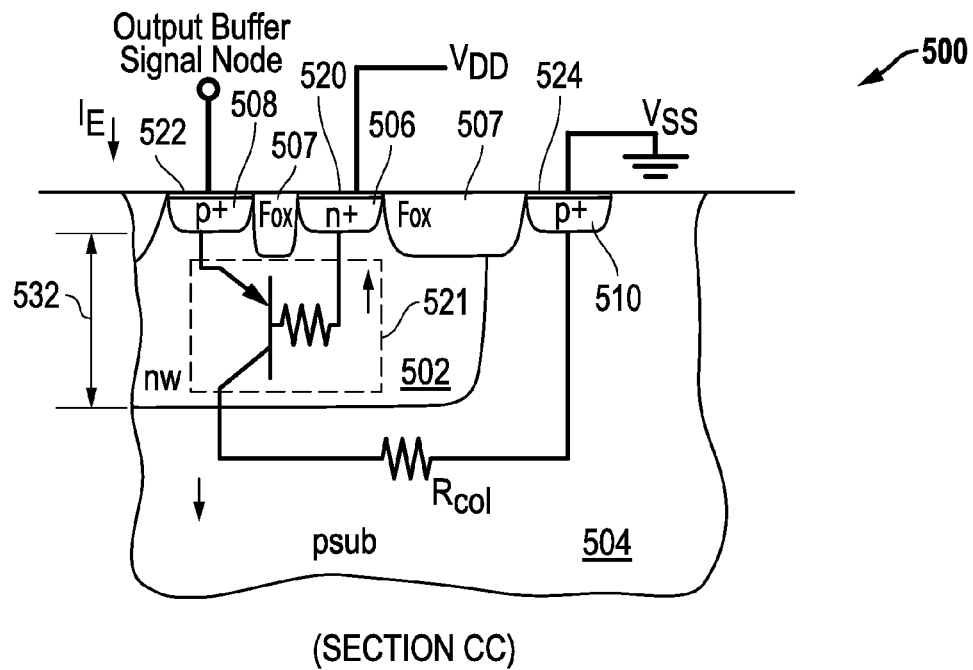
FIG. 5B illustrates a partial cross-sectional view of layout topology for an Nwell diode according to one exemplary embodiment of the disclosed circuit topologies and methods.
Figure 5C:
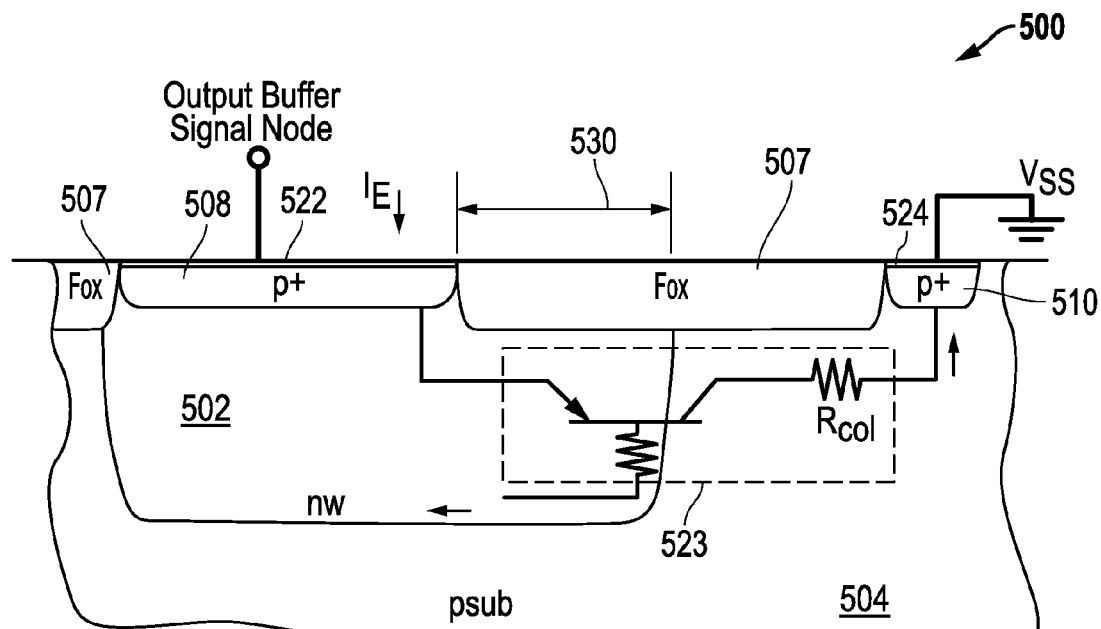
FIG. 5C illustrates a partial cross-sectional view of layout topology for an Nwell diode according to one exemplary embodiment of the disclosed circuit topologies and methods.

FIGS. 5A-5C illustrate one exemplary embodiment of a layout topology for an Nwell ESD diode 500. The circuit topology of ESD diode 500 and other embodiments of Nwell diode circuitry topology described herein may be employed, for example, as ESD diodes coupled between output signal pad and positive supply rail ($V_{DD}$) in signal output circuitry such as described in U.S. patent application Ser. No. 14/149, 112 filed Jan. 7, 2014 and entitled "Snapback Inhibiting Clamp Circuitry for MOSFET ESD Protection Circuits" by Smith, which is incorporated herein by reference in its entirety.

As shown in FIG. 5A, Nwell diode 500 includes an Nwell 502 formed in a P-type substrate 504. Parallel elongated N+ doped regions 506 and P+ doped regions 508 of unequal length are formed within Nwell 502 as shown. A P+ doped guard ring structure 510 coupled via conductive (e.g., metal) pads 524 to a negative supply rail ($V_{SS}$) is formed as shown to surround and laterally enclose elongated N+ doped finger regions 506 and P+ doped regions 508, a positive supply rail ($V_{DD}$) may be coupled to N+ doped regions via conductive (e.g., metal) pads 520, and conductive (e.g., metal) pads 522 of P+ doped regions 508 coupled to an output signal node or pad of an output buffer circuit. As shown in FIG. 5A, the emitter ends of the P+ doped elongated finger regions 508 may be recessed inward relative to the ends of the N+ doped elongated finger regions away from the edge of the surrounding Nwell region 502 with no N+ doped region disposed between the first and second ends of the elongated P+ doped regions 508 and the surrounding P+ doped guard ring structure 510 in a non-enclosed manner that simultaneously decreases the strength of the electric field and value of β across the lateral PNP device formed between a parasitic emitter that exists at the end of each elongated P+ doped region 508 and the P-type substrate 504 and P+ doped guard ring structure 510. This effectively extends the failure voltage of the overall device, thus providing more ESD design margin. At the same time, non-recessed ends of the N+ doped elongated finger regions 506 extend to a position that is closer to the edge of the Nwell region 502 to tie the Nwell 502 and provide better latch-up immunity. Also shown in FIGS. 5B and 5C are field oxide regions 507 (oxide regions 507 not shown in FIG. 5A).

Figure 1:
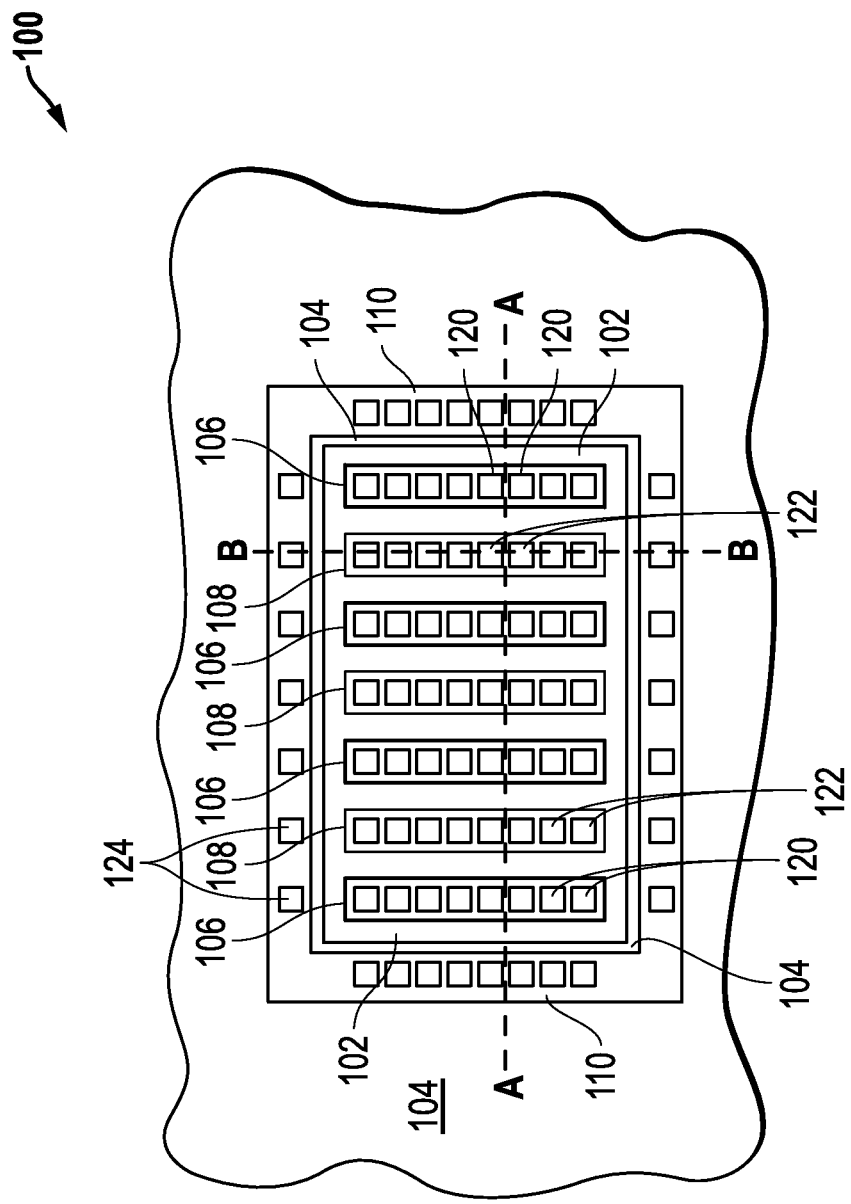
FIG. 1 illustrates an overhead view of layout topology for a conventional Nwell diode.
Figure 2:
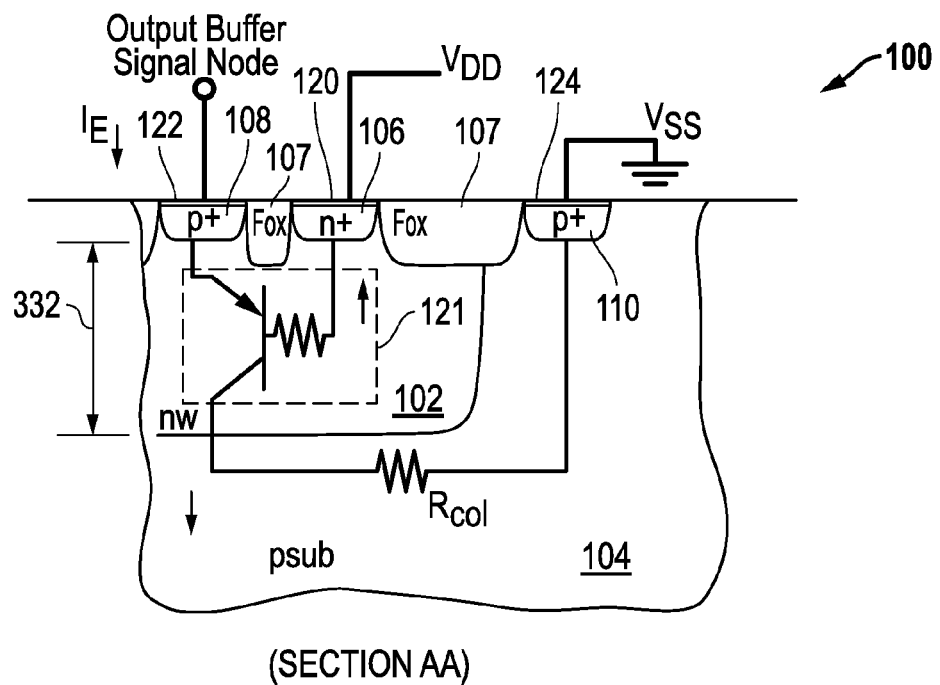
FIG. 2 illustrates a partial cross-sectional view of the layout topology for a conventional Nwell diode.
Figure 3:
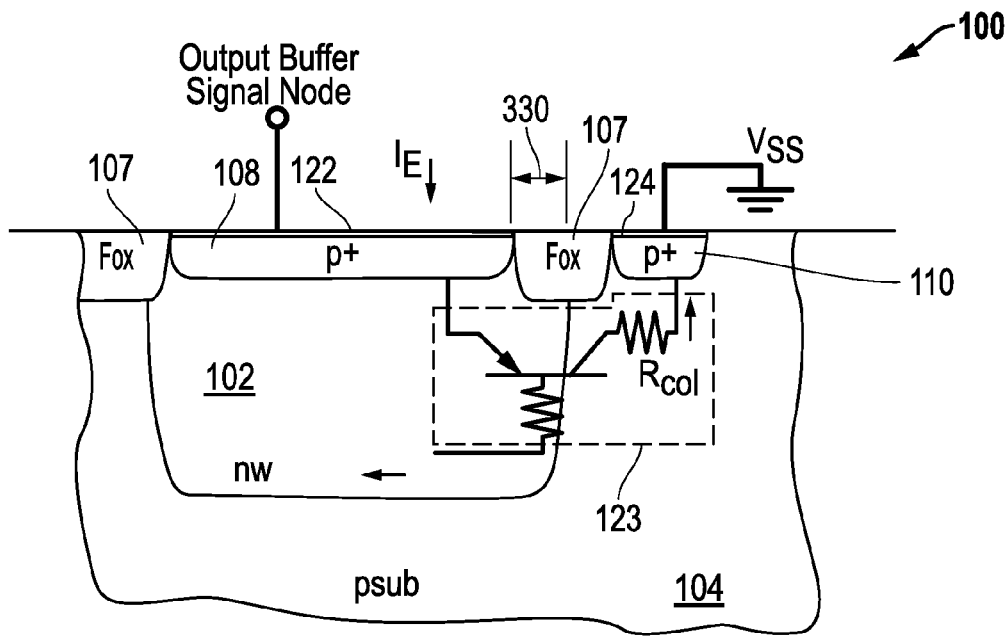
FIG. 3 illustrates a partial cross-sectional view of layout topology for a conventional Nwell diode.
Figure 4:
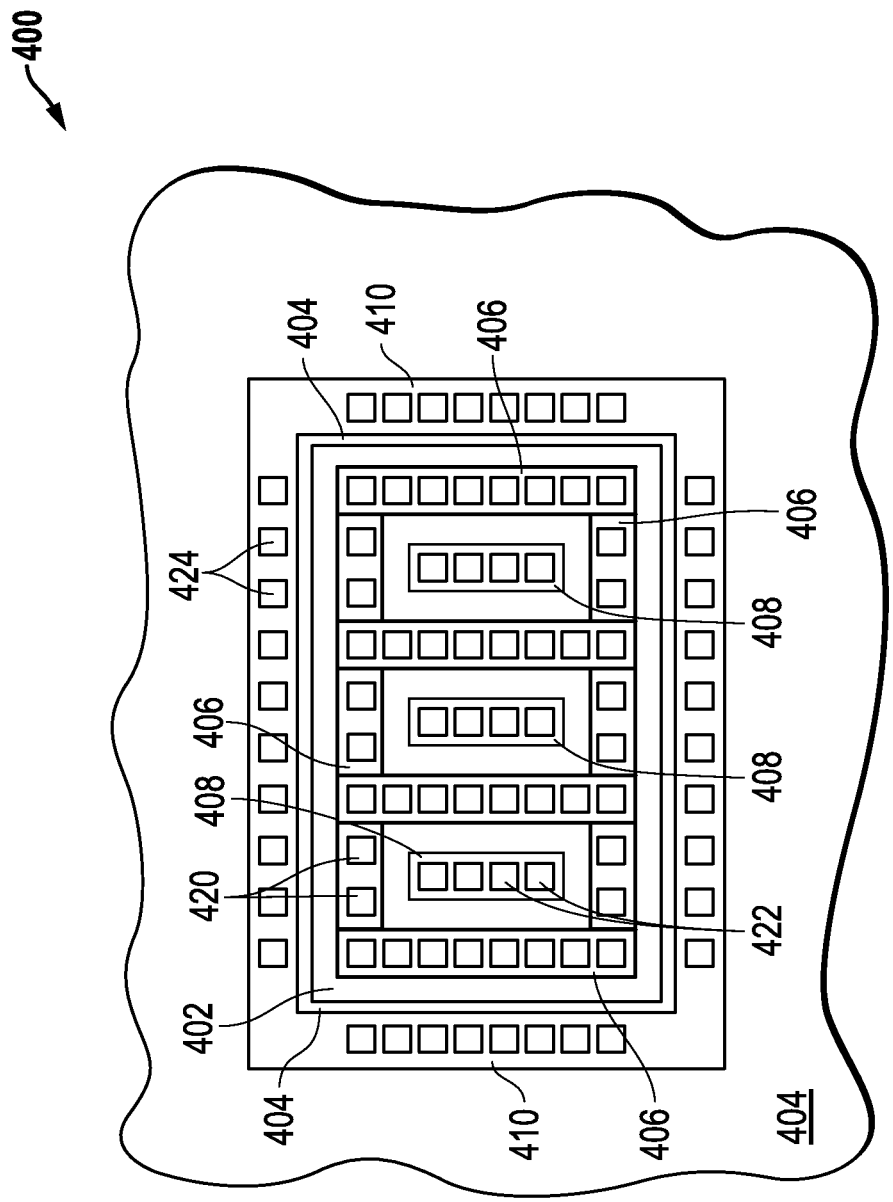
FIG. 4 illustrates an overhead view of layout topology for a conventional Nwell diode.

The diode circuit layout topology of the embodiment of 5A may be advantageously implemented to increase the breakdown voltage of lateral parasitic bipolar PNP devices in comparison to conventional non-recessed P+ doped elongated finger regions such as illustrated in FIGS. 1-3. For example, referring to the conventional layout of the Nwell diode 100 previously described in relation to FIGS. 1-3 (and assuming 90 nanometer process technology), the base width 332 of the vertical parasitic PNP device 121 is approximately 2 μm, and the base width 330 of the lateral parasitic PNP device 123 is approximately 0.5 to 0.6 μm. This results in a ratio of vertical base width to lateral base width of approximately 4. Such a vertical to lateral device base width ratio results in a higher strength electric field between the ends of the diode P+ doped fingers 108 and the P-type substrate region 104 lying between the Nwell 102 and the P+ guard ring 110 as compared to the electric field strength between the P+ doped fingers 108 and the P-type substrate 104 region below the Nwell 102. Further, although the β (or gain) of a parasitic device depends on doping profiles and other factors, there is in inverse relationship between β and the device base width. As such, the shorter base width of the lateral parasitic PNP bipolar device 123 causes the lateral parasitic PNP device 123 to have a β that is higher than the β of the vertical parasitic PNP bipolar device 121, which promotes unwanted conduction through the lateral parasitic PNP bipolar device 123 during ESD events on conductive pad 122. The combination of higher strength electric field and higher β for the lateral parasitic PNP device 123 typically causes earlier breakdown of the lateral device 123 as compared to the vertical device 121.

In contrast, FIG. 5B illustrates a section C-C of the exemplary embodiment of FIG. 5A and its vertical parasitic PNP bipolar action during occurrence of an electrostatic discharge (ESD) event that causes a portion of ESD current ($I_E$) from conductive pad 522 to flow to $V_{SS}$, while FIG. 5C illustrates section D-D of FIG. 5 and its lateral parasitic PNP bipolar action during occurrence of the same ESD event. Again assuming a 90 nanometer process technology, the base width 532 of the vertical parasitic PNP device 521 in one embodiment may be approximately 2 μm. However, in the same exemplary embodiment, the base width 530 of the lateral parasitic PNP device 523 may be about 3 μm, which yields a vertical to lateral device base width ratio of about 0.67, although greater or lesser values of base width 530 are also possible, including for example alternatively greater than about 3 μm, alternatively greater than or equal to about 3 μm, alternatively less than about 3 μm, etc. Consequently, the lateral electric field between the ends of the diode P+ doped fingers 508 and the P-type substrate region 504 lying between the Nwell 502 and the P+ guard ring 510 is decreased in strength relative to the strength of the vertical electric field between the P+ doped fingers 508 and the P-type substrate 504 region below the Nwell 502. Further, the lateral parasitic PNP device 523 has a β that is lower than the β of the vertical parasitic PNP bipolar device 521, which discourages conduction through the lateral parasitic PNP bipolar device 523 during ESD events, and substantially prevents earlier breakdown of the lateral device 523 as compared to the vertical device 521. At the same time, the non-recessed ends of N+ doped elongated finger regions 506 may be kept relatively close (e.g., from about 0.25 μm to about 0.3 μm) to the edge of Nwell region 502 so as to robustly tie the Nwell region 502 to positive supply rail ($V_{DD}$) and thus provide better latch-up immunity.

It will be understood that the particular vertical and lateral base width values and vertical to lateral device base width ratio given in relation to the Nwell diode 500 of FIGS. 5B-5C are exemplary only, and may vary as desired or needed to fit a given application. Moreover, the disclosed circuit layout topology may be implemented with other process technology scales greater or less than 90 nanometers, e.g., including other process scales such as 180 nm to 14 nm etc. In this regard, a circuit layout topology may be employed to provide a Nwell diode in a P-type substrate having alternating and parallel elongated N+ doped regions and P+ doped regions formed within an Nwell in which emitter ends of the P+ doped elongated finger regions are recessed away from the edge of the surrounding Nwell region in any amount that acts to decrease the strength of the electric field and/or that acts to decrease the value of β across the lateral PNP device formed between the parasitic emitter that exists at the end of each elongated P+ doped region. In one exemplary embodiment, the ends of the P+ doped elongated finger regions may be recessed away from the edge of the surrounding Nwell region so as to yield a vertical to lateral device base width ratio of less than about 0.8, alternatively from about 0.8 to about 0.6, further alternatively from about 0.6 to about 0.4, and further alternatively from about 0.8 to about 0.4. At the same time the non-recessed ends of the N+ doped elongated finger regions may be kept a within a lateral distance of from about 0.25 μm to about 0.32 μm of the edge of the Nwell, e.g., to tie the Nwell to a supply rail structure, e.g., such as guard ring that surrounds the Nwell. It will be understood that the above value ranges of vertical to lateral base width ratio and lateral distance to the edge of the Nwell are exemplary only, and that greater and lesser ratio and/or distance values are also possible.

It will also be understood that the disclosed circuit layout topologies are not limited to Nwell diodes such as described and illustrated with regard to FIGS. 5A-5C. In this regard, it will be understood that the disclosed circuit layout topologies may be employed with any type of diodic circuit structure that includes parallel elongated doped regions or fingers, the body of which form a vertically-oriented parasitic bipolar device with an underlying region of the circuit structure, and the ends of which each form a laterally-oriented parasitic bipolar device. The diodic structure may include parallel elongated doped regions of alternating polarity (e.g., N+ doped and P+ doped) that are disposed within a base layer well (e.g., such a Nwell or Pwell/Rwell) such that the ends of each elongated region either forms a lateral parasitic bipolar emitter or well tie with surrounding base layers of the structure depending on the relative polarity of the given elongated region and the adjacent layers of the structure. Examples of other such circuit layout topologies include, but are not limited to, deep Nwell diodes such as illustrated and described below in relation to FIGS. 6-9 below.

Figure 6:
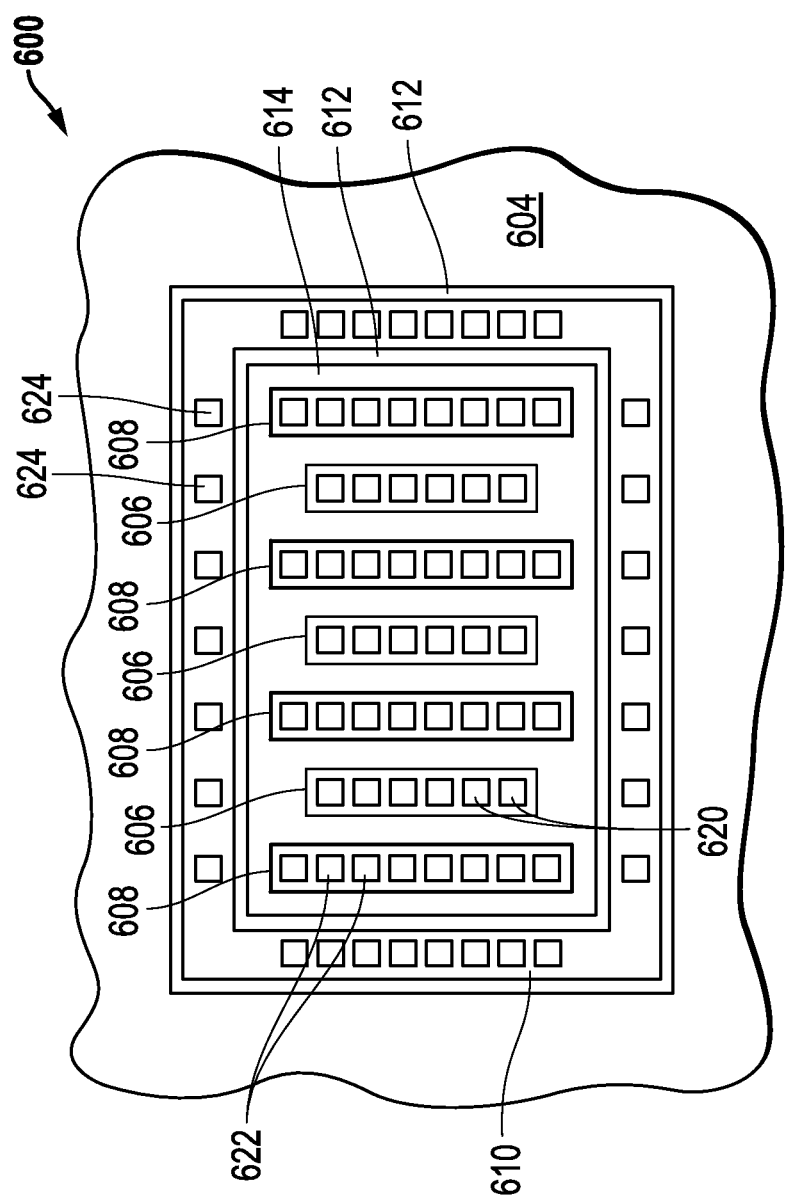
FIG. 6 illustrates an overhead view of layout topology for a deep Nwell diode according to one exemplary embodiment of the disclosed circuit topologies and methods.

FIG. 6 illustrates one exemplary embodiment of a deep Nwell ESD diode 600. The circuit topology of ESD diode 600 and other embodiments of deep Nwell diode circuit topology described herein may be employed, for example, as ESD diodes coupled between output signal pad and negative supply rail ($V_{SS}$) in signal output circuitry such as described in U.S. patent application Ser. No. 14/149,112 filed Jan. 7, 2014 and entitled "Snapback Inhibiting Clamp Circuitry for MOSFET ESD Protection Circuits" by Smith, which is incorporated herein by reference in its entirety.

As shown in FIG. 6, deep Nwell diode 600 includes a Pwell/Rwell 614 formed in a deep Nwell 615 (see cross sections A-A' and B-B' of FIGS. 8 and 9) that itself is formed within a P-type substrate 604. Parallel elongated N+ doped regions 606 and P+ doped regions 608 of unequal length are formed within Pwell/Rwell 614 as shown. A N+ doped/nwell guard ring structure 610 that may be coupled to a positive supply rail ($V_{DD}$) by conductive (e.g., metal) pads 624 is formed as shown to surround and laterally enclose elongated N+ doped finger regions 606 and P+ doped regions 608, and an output buffer signal node (e.g., pad) may be coupled to N+ doped regions 606 by conductive (e.g., metal) pads 620. A negative supply rail ($V_{SS}$) may be coupled to P+ doped regions 608 via conductive (e.g., metal) pads 622. As shown in FIG. 6, the emitter ends of the N+ doped elongated finger regions 606 may be recessed inward relative to the ends of the P+ doped elongated finger regions 608 away from the edge of the surrounding Pwell/Rwell region 614 with no P+ doped region disposed between the first and second ends of the elongated N+ doped regions 606 and the surrounding N+ doped/nwell guard ring 610 in a non-enclosed manner. Recessing the emitter ends of the N+ doped elongated finger regions 606 simultaneously decreases the strength of the electric field and value of β across the lateral NPN device formed between a parasitic emitter that exists at the end of each elongated N+ doped region 606 and the Pwell/Rwell region 614 and N+ doped/nwell guard ring structure 610. In the same manner as PNP structure of FIGS. 5A-5C, the layout of FIG. 6 effectively extends the failure voltage of the overall device, thus providing more ESD design margin. Moreover, the non-recessed ends of the P+ doped elongated finger regions 608 extend to a position that is closer to the edge of the Pwell/Rwell region 614 to tie the Pwell/Rwell 614 and provide better latch-up immunity.

Figure 7:
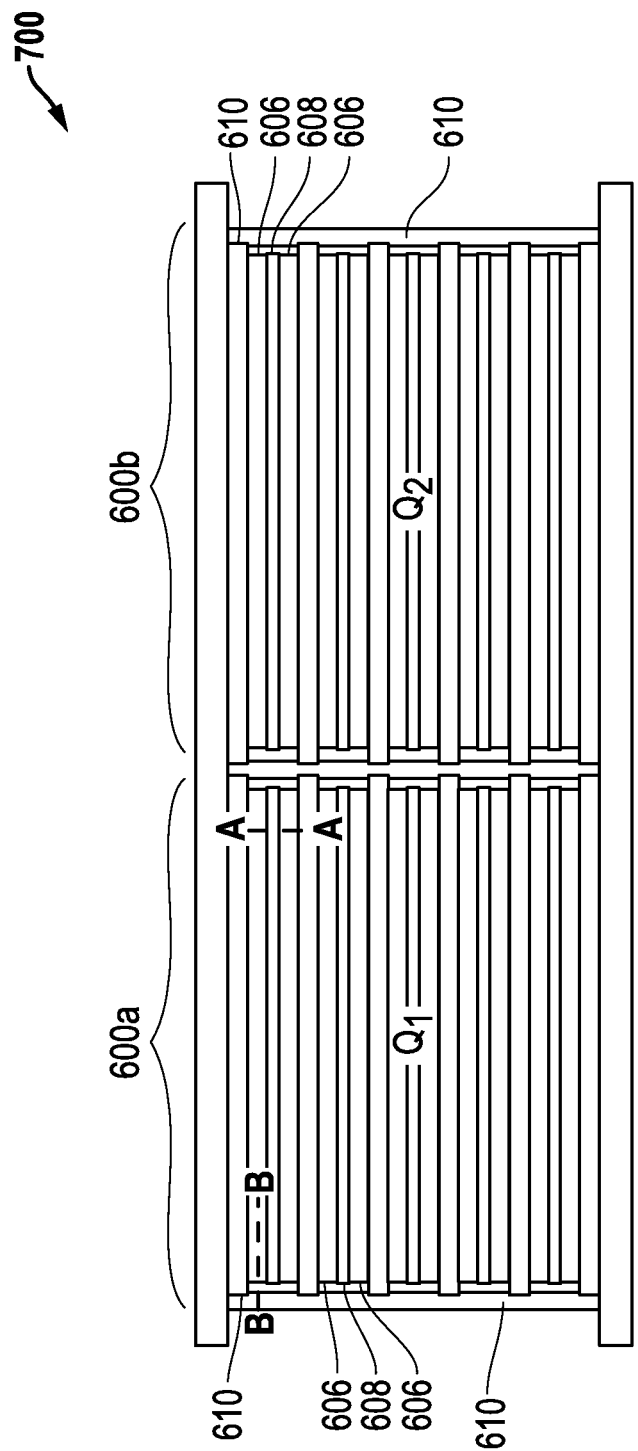
FIG. 7 illustrates an overhead view of an ESD diode circuit layout according to one exemplary embodiment of the disclosed circuit topologies and methods.
Figure 8:
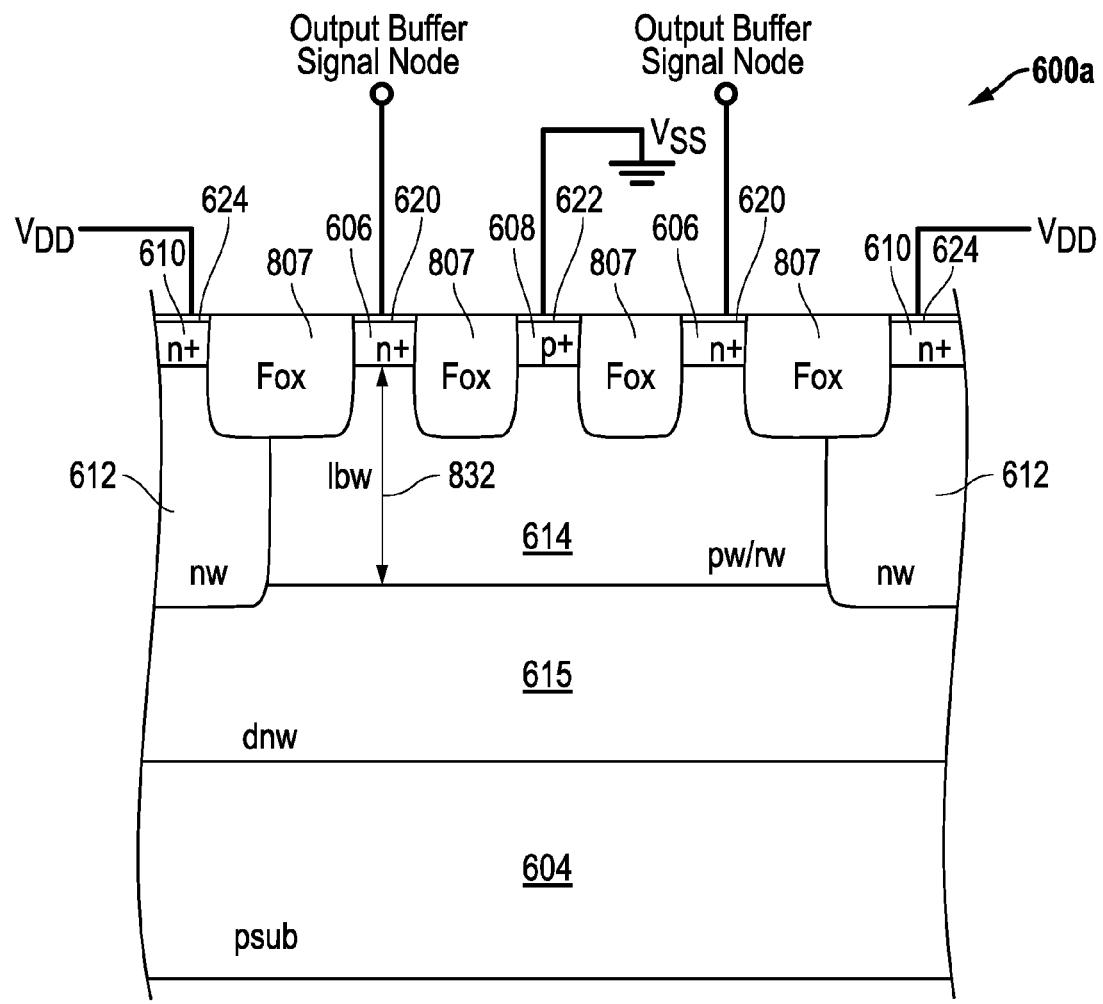
FIG. 8 illustrates a partial cross-sectional view of layout topology for a deep Nwell diode according to one exemplary embodiment of the disclosed circuit topologies and methods.
Figure 9:
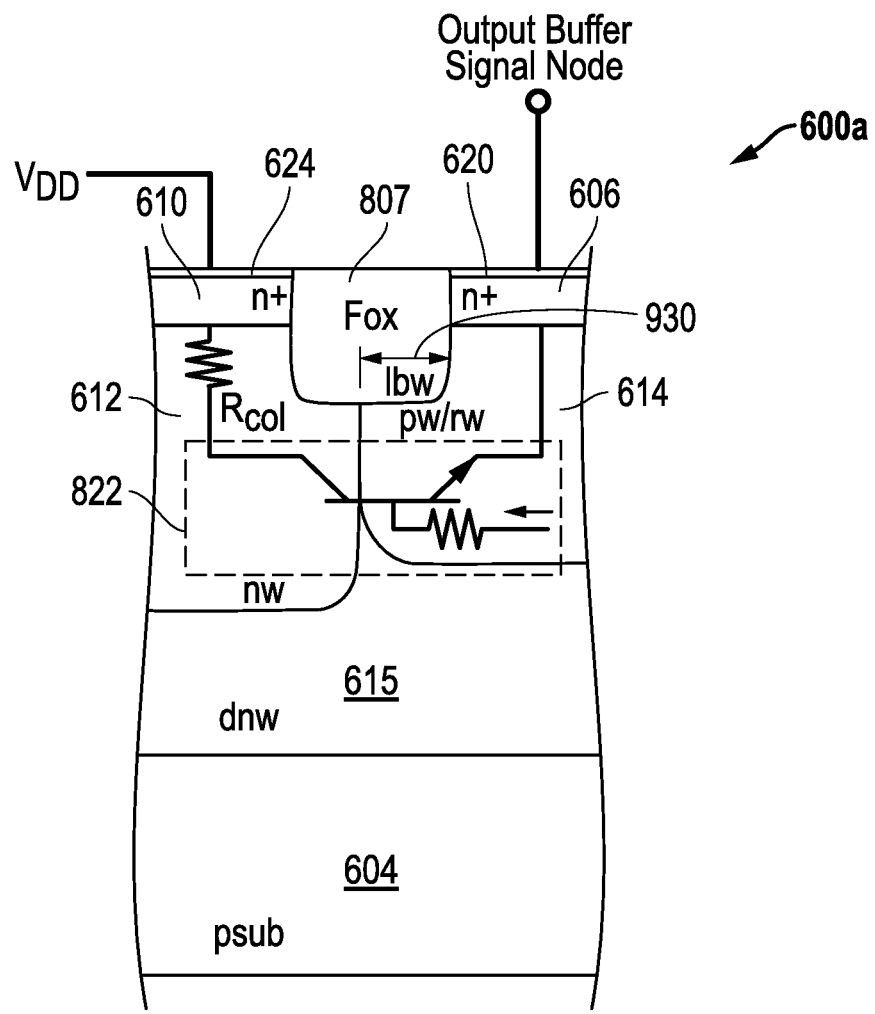
FIG. 9 illustrates a partial cross-sectional view of layout topology for a deep Nwell diode according to one exemplary embodiment of the disclosed circuit topologies and methods.

FIG. 7 illustrates one exemplary embodiment of an ESD diode circuit layout 700 that includes two adjacent deep Nwell diode structures 600a and 600b, as they may be configured using the circuit layout described in relation to FIG. 6. FIG. 8 illustrates a section A-A' of diode structure 600a of FIG. 7 with field oxide regions 807, and FIG. 9 illustrates a section B-B' of diode structure 600a of FIG. 7 with field oxide regions 807 (oxide regions 807 not shown in FIG. 6). In such an embodiment, potential for both vertical parasitic NPN bipolar device action and lateral parasitic NPN bipolar device action may exist during the occurrence of an electrostatic discharge (ESD) event that results in ESD current ($I_E$) flow from N+ regions 606. However, in a manner similar to the exemplary PNP embodiment of FIGS. 5A-5C, ESD diode circuit layout 700 may be fabricated such that the base width 832 of the vertical parasitic NPN device may be set relative to the base width 930 of the lateral parasitic NPN device 822 using the same relative design dimensions and/or ratios as used for the vertical and lateral parasitic PNP devices of FIGS. 5A-5C, e.g., to yield a vertical to lateral device base width ratio of about 0.5 for the NPN devices of FIGS. 6-9. In one exemplary embodiment, the base width 930 of the lateral parasitic NPN device 930 may be about 3 µm (alternatively greater than about 3 µm, or greater than or equal to about 3 µm), although greater or lesser values of base width 930 are also possible.

Thus, the strength of the lateral electric field between the ends of the diode N+ doped fingers 606 and the Nwell region 612 lying between the Pwell/Rwell 614 and the N+/Nwell guard ring 610 may be configured to be lower than the strength of the vertical electric field between the N+ doped fingers 606 and the deep Nwell region 615 below the Pwell/Rwell 614, such that the lateral parasitic NPN device may have a β that is lower than the β of the vertical parasitic NPN bipolar device, which discourages conduction through the lateral parasitic NPN bipolar device 822 during ESD events, substantially preventing earlier breakdown of the lateral parasitic device as compared to the vertical parasitic device. At the same time, the non-recessed ends of P+ doped elongated finger regions 608 may be kept relatively close (e.g., from about 0.25 µm to about 0.32 µm) to the edge of Pwell/Rwell region 614 so as to tie the Pwell/Rwell region 614 to negative supply rail ($V_{SS}$) and thus provide better latch-up immunity.

As with the embodiment of FIGS. 5A-5C, the particular individual vertical and lateral parasitic base width values and the vertical to lateral device base width ratio of the deep Nwell diode embodiment 600 of FIGS. 7-9 may vary as desired or needed to fit a given application and may be implemented with process technology scales such as described in relation to the embodiment of FIGS. 5-7. As with the Nwell diode embodiment of FIGS. 5A-5C, a circuit layout topology of FIGS. 7-9 may be employed to provide a deep Nwell diode having alternating and parallel elongated N+ doped regions and P+ doped regions formed within a Pwell in which emitter ends of the N+ doped elongated finger regions are recessed away from the edge of the surrounding Pwell region in any amount that acts to decrease the electric field and/or acts to decrease the value of β across the lateral NPN device formed between the parasitic emitter that exists at the end of each elongated N+ doped region. In this regard, the ends of the N+ doped elongated finger regions 606 may be recessed away from the edge of the surrounding Nwell region 612 so as to yield a vertical to lateral device base width ratio of less than about 0.6, alternatively from about 0.6 to about 0.4, further alternatively from about 0.5 to about 0.25, and further alternatively from about 0.6 to about 0.25. At the same time the non-recessed ends of the P+ doped elongated finger regions 608 may be kept a within a lateral distance of from about 0.25 to about 0.32 of the edge of the Pwell/Rwell region 614, e.g., to tie the Pwell/Rwell region 614 to the $V_{SS}$ supply rail. Once again, it will be understood that the above value ranges of vertical to lateral base width ratio and lateral distance to the edge of the Nwell are exemplary only, and that greater and lesser ratio and/or distance values are also possible.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed circuitry and methods may be utilized in various combinations and/or independently. Thus the invention is not limited to only those combinations shown herein, but rather may include other combinations.

What is claimed is:

1. A semiconductor circuit device, comprising:
   a semiconductor substrate; and
   at least one diode structure formed in the substrate, the diode structure comprising elongated N+ doped regions alternating with elongated P+ doped regions that are together surrounded by a P+ doped or N+ doped/Nwell guard ring;
   where each of the elongated N+ doped regions extend between first and second ends with no P+ doped region disposed between the first and second ends of the elongated N+ doped regions and the surrounding guard ring, and each of the elongated P+ doped regions extend between first and second ends with no N+ doped region disposed between the first and second ends of the elongated P+ doped regions and the surrounding guard ring; and
   where either:
      the first and second ends of the elongated P+ doped regions are each recessed inward relative to the first and second ends of the elongated N+ doped regions such that a lateral distance between each of the first and second ends of the elongated P+ doped regions and the surrounding guard ring is greater than a lateral distance between each of the first and second ends of the elongated N+ doped regions and the surrounding guard ring, or
      the first and second ends of the elongated N+ doped regions are each recessed inward relative to the first and second ends of the elongated P+ doped regions such that a lateral distance between each of the first and second ends of the elongated N+ doped regions and the surrounding guard ring is greater than a lateral distance between each of the first and second ends of the elongated P+ doped regions and the surrounding guard ring.

2. The circuit device of claim 1, where the diode structure is a Nwell diode structure comprising elongated N+ doped regions alternating with elongated P+ doped regions that are together surrounded by a P+ doped guard ring; and where the first and second ends of the elongated P+ doped regions are each recessed inward relative to the first and second ends of the elongated N+ doped regions such that a lateral distance between each of the first and second ends of the elongated P+ doped regions and the surrounding guard ring is greater than a lateral distance between each of the first and second ends of the elongated N+ doped regions and the surrounding guard ring.

3. The circuit device of claim 2, where the substrate is a P-type substrate; where the Nwell diode structure further comprises a Nwell region formed in the P-type substrate, the Nwell region having an outer periphery; where each of the elongated N+ doped regions and the elongated P+ doped regions are formed within the Nwell region; and where the surrounding P+ doped guard ring is formed within the P-type substrate outside the periphery of the Nwell region.

4. The circuit device of claim 3, where a lateral distance between each of the first and second ends of the P+ doped regions and outer periphery of the Nwell region is greater than or equal to the vertical distance between a bottom side of each of the P+ doped regions and the outer periphery of the Nwell region.

5. The circuit device of claim 3, where a ratio of the vertical distance between a bottom side of each of the P+ doped regions and the outer periphery of the Nwell region to the lateral distance between each of the first and second ends of the P+ doped regions and outer periphery of the Nwell region is from about 0.8 to about 0.4.

6. The circuit device of claim 2, where the diode structure is an electrostatic discharge (ESD) diode; where the P+ doped guard ring is electrically coupled to a negative supply rail; where each of the elongated N+ doped regions is electrically coupled to a positive supply rail; and where each of the elongated P+ doped regions is coupled to an output buffer signal node.

7. The circuit device of claim 1, where the diode structure is a deep Nwell diode structure comprising elongated N+ doped regions alternating with elongated P+ doped regions that are together surrounded by a N+ doped/Nwell guard ring; and where the first and second ends of the elongated N+ doped regions are each recessed inward relative to the first and second ends of the elongated P+ doped regions such that a distance between each of the first and second ends of the elongated N+ doped regions and the surrounding guard ring is greater than a distance between each of the first and second ends of the elongated P+ doped regions and the surrounding guard ring.

8. The circuit device of claim 7, where the substrate is a P-type substrate; where the deep Nwell diode structure further comprises a deep Nwell formed in the P-type substrate; a Pwell/Retrograde well (Pwell/Rwell) region formed in the deep Nwell, the Pwell/Rwell region having an outer periphery; a N+ doped/Nwell guard ring region formed in the deep Nwell around the outer periphery of the Pwell/Rwell region; where each of the elongated N+ doped regions and the elongated P+ doped regions are formed within the Pwell/Rwell region.

9. The circuit device of claim 8, where a lateral distance between each of the first and second ends of the N+ doped regions and outer periphery of the Pwell/Rwell region is greater than or equal to the vertical distance between a bottom side of each of the N+ doped regions and the outer periphery of the Pwell/Rwell region.

10. The circuit device of claim 8, where a ratio of the vertical distance between a bottom side of each of the N+ doped regions and the outer periphery of the Pwell/Rwell region to the lateral distance between each of the first and second ends of the N+ doped regions and outer periphery of the Pwell/Rwell region is from about 0.6 to about 0.25.

11. The circuit device of claim 7, where the diode structure is an electrostatic discharge (ESD) diode; where the N+ doped/Nwell guard ring is electrically coupled to a positive supply rail; where each of the elongated N+ doped regions is electrically coupled to an output buffer signal node; and where each of the elongated P+ doped regions is coupled to a negative supply rail.

12. The circuitry device of claim 1, where each of the elongated P+ doped regions and elongated N+ doped regions has a longitudinal axis; and where the longitudinal axis of each of the elongated P+ doped regions and elongated N+ doped regions is oriented substantially parallel to the longitudinal axis of each of the other elongated P+ doped regions and elongated N+ doped regions.

13. A semiconductor electrostatic discharge (ESD) diode circuit device, comprising:
   a semiconductor substrate; and
   at least one diode structure formed in the substrate, the diode structure comprising elongated N+ doped regions alternating with elongated P+ doped regions that are together surrounded by a P+ doped or N+ doped/Nwell guard ring;
   where each of the elongated N+ doped regions extend between first and second ends with no P+ doped region disposed between the first and second ends of the elongated N+ doped regions and the surrounding guard ring, and each of the elongated P+ doped regions extend between first and second ends with no N+ doped region disposed between the first and second ends of the elongated P+ doped regions and the surrounding guard ring; and
   where either:
      the first and second ends of the elongated P+ doped regions are each recessed inward relative to outwardly projecting first and second ends of the elongated N+ doped regions such that a lateral distance between each of the first and second ends of the elongated P+ doped regions and the surrounding guard ring is greater than a lateral distance between each of the first and second ends of the elongated N+ doped regions and the surrounding guard ring, each of the elongated P+ doped regions being coupled to an output buffer signal node, each of the elongated N+ doped regions being coupled to a positive supply rail, and the surrounding guard ring being coupled to a negative supply rail, or
      the first and second ends of the elongated N+ doped regions are each recessed inward relative to outwardly projecting first and second ends of the elongated P+ doped regions such that a lateral distance between each of the first and second ends of the elongated N+ doped regions and the surrounding guard ring is greater than a lateral distance between each of the first and second ends of the elongated P+ doped regions and the surrounding guard ring, each of the elongated N+ doped regions being coupled to an output buffer signal node, each of the elongated P+ doped regions being coupled to a negative supply rail, and the surrounding guard ring being coupled to a positive supply rail.

14. The circuit device of claim 13, where the diode structure is a Nwell diode structure comprising elongated N+ doped regions alternating with elongated P+ doped regions that are together surrounded by a P+ doped guard ring; and where the first and second ends of the elongated P+ doped regions are each recessed inward relative to outwardly projecting first and second ends of the elongated N+ doped regions such that a lateral distance between each of the first and second ends of the elongated P+ doped regions and the surrounding guard ring is greater than a lateral distance between each of the first and second ends of the elongated N+ doped regions and the surrounding guard ring.

15. The circuit device of claim 14, where the substrate is a P-type substrate; where the Nwell diode structure further comprises a Nwell region formed in the P-type substrate, the Nwell region having an outer periphery; where each of the elongated N+ doped regions and the elongated P+ doped regions are formed within the Nwell region; and where the surrounding P+ doped guard ring is formed within the P-type substrate outside the periphery of the Nwell region.

16. The circuit device of claim 15, where a lateral distance between each of the first and second ends of the P+ doped regions and outer periphery of the Nwell region is greater than or equal to the vertical distance between a bottom side of each of the P+ doped regions and the outer periphery of the Nwell region.

17. The circuit device of claim 15, where a ratio of the vertical distance between a bottom side of each of the P+ doped regions and the outer periphery of the Nwell region to the lateral distance between each of the first and second ends of the P+ doped regions and outer periphery of the Nwell region is from about 0.8 to about 0.4.

18. The circuit device of claim 13, where the diode structure is a deep Nwell diode structure comprising elongated N+ doped regions alternating with elongated P+ doped regions that are together surrounded by a N+ doped/Nwell guard ring; and where the first and second ends of the elongated N+ doped regions are each recessed inward relative to the outwardly projecting first and second ends of the elongated P+ doped regions such that a distance between each of the first and second ends of the elongated N+ doped regions and the surrounding guard ring is greater than a distance between each of the first and second ends of the elongated P+ doped regions and the surrounding guard ring.

19. The circuit device of claim 18, where the substrate is a P-type substrate; where the deep Nwell diode structure further comprises a deep Nwell formed in the P-type substrate; a Pwell/Retrograde well (Pwell/Rwell) region formed in the deep Nwell, the Pwell/Rwell region having an outer periphery; a N+ doped/Nwell region formed in the deep Nwell around the outer periphery of the Pwell/Rwell region; where each of the elongated N+ doped regions and the elongated P+ doped regions are formed within the Pwell/Rwell region.

20. The circuit device of claim 19, where a lateral distance between each of the first and second ends of the N+ doped regions and outer periphery of the Pwell/Rwell region is greater than or equal to the vertical distance between a bottom side of each of the N+ doped regions and the outer periphery of the Pwell/Rwell region.

21. The circuit device of claim 19, where a ratio of the vertical distance between a bottom side of each of the N+ doped regions and the outer periphery of the Pwell/Rwell region to the lateral distance between each of the first and second ends of the N+ doped regions and outer periphery of the Pwell/Rwell region is from about 0.6 to about 0.25.

22. The circuitry device of claim 13, where each of the elongated P+ doped regions and elongated N+ doped regions has a longitudinal axis; and where the longitudinal axis of each of the elongated P+ doped regions and elongated N+ doped regions is oriented substantially parallel to the longitudinal axis of each of the other elongated P+ doped regions and elongated N+ doped regions.

* * * * *